(12) United States Patent
Hsu et al.

(10) Patent No.: US 12,512,323 B2
(45) Date of Patent: Dec. 30, 2025

(54) METHOD OF MANUFACTURING A REPLACEMENT METAL GATE DEVICE STRUCTURE

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Min Han Hsu, Hsinchu (TW); Jung-Chih Tsao, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 370 days.

(21) Appl. No.: 17/884,773

(22) Filed: Aug. 10, 2022

(65) Prior Publication Data

US 2022/0384195 A1 Dec. 1, 2022

Related U.S. Application Data

(62) Division of application No. 17/165,078, filed on Feb. 2, 2021, now Pat. No. 11,769,669.

(30) Foreign Application Priority Data

Jul. 1, 2020 (CN) .......................... 202010620909.2

(51) Int. Cl.
*H01L 21/28* (2025.01)
*H10D 30/01* (2025.01)
(Continued)

(52) U.S. Cl.
CPC ...... *H01L 21/28088* (2013.01); *H10D 30/024* (2025.01); *H10D 30/6211* (2025.01); *H10D 64/017* (2025.01); *H10D 64/667* (2025.01)

(58) Field of Classification Search
CPC ......... H01L 21/28008; H01L 21/28088; H01L 29/49; H01L 29/4958; H01L 29/4966; H10D 64/66; H10D 64/666; H10D 64/667
See application file for complete search history.

(56) References Cited

U.S. PATENT DOCUMENTS 7,964,505 B2 * 6/2011 Khandelwal ...... H01L 21/76855
257/E21.585
9,698,241 B1 7/2017 Patil et al.
(Continued)

FOREIGN PATENT DOCUMENTS

CN 104810368 7/2015
CN 107887428 4/2018

OTHER PUBLICATIONS

Office Action dated Apr. 25, 2022 for corresponding case No. 11120396340. (pp. 1-10).

*Primary Examiner* — Tuan A Hoang
(74) *Attorney, Agent, or Firm* — Hauptman Ham, LLP

(57) ABSTRACT

A method of fabricating a semiconductor device includes forming a dummy gate structure over a semiconductor fin. The dummy gate structure includes a dummy gate stack and gate spacers along sidewalls of the dummy gate stack. The method further includes forming an inter-layer dielectric (ILD) layer surrounding the dummy gate structure, removing the dummy gate stack to provide an opening exposing a channel region of the semiconductor fin, depositing a gate dielectric layer over bottom and sidewalls of the opening and over the ILD layer, forming a doped work function material layer over the gate dielectric layer using an in-situ (Continued)

doping process, and depositing a gate electrode layer over the doped work function material layer.

20 Claims, 6 Drawing Sheets

(51) Int. Cl.
*H10D 30/62* (2025.01)
*H10D 64/01* (2025.01)
*H10D 64/66* (2025.01)

(56) References Cited

U.S. PATENT DOCUMENTS

| | | | |
|---|---|---|---|
| 10,607,895 B2* | 3/2020 | Xie | H10D 64/685 |
| 2007/0173008 A1* | 7/2007 | Chudzik | H10D 64/691 |
| | | | 257/E21.639 |
| 2009/0179285 A1 | 7/2009 | Wood et al. | |
| 2017/0062211 A1 | 3/2017 | Lim et al. | |
| 2018/0019164 A1* | 1/2018 | Murray | H01L 21/76843 |
| 2018/0097085 A1 | 4/2018 | Wang et al. | |
| 2019/0088555 A1 | 3/2019 | Xie et al. | |
| 2019/0148506 A1* | 5/2019 | Kanakamedala | H10B 43/50 |
| | | | 257/315 |
| 2019/0148510 A1 | 5/2019 | Chien et al. | |
| 2020/0388707 A1* | 12/2020 | Shen | H10D 84/038 |
| 2021/0028291 A1 | 1/2021 | Park et al. | |

* cited by examiner

METHOD OF MANUFACTURING A REPLACEMENT METAL GATE DEVICE STRUCTURE

RELATED APPLICATIONS

This application is a divisional of U.S. application Ser. No. 17/165,078, filed Feb. 2, 2021, now U.S. Pat. No. 11,769,669, issued Sep. 26, 2023, which claims the priority of China Application No. 202010620909.2, filed Jul. 1, 2020, the contents of which are hereby incorporated by reference in their entireties.

BACKGROUND

As demands to reduce the dimensions of transistor devices continue, challenges from both fabrication and design issues have resulted in the development of a three-dimensional device architecture, such as a fin-type field effect transistor (FinFET) and the use of a metal gate structure with a high-k gate dielectric material. In some instances, metal gates are manufactured using a replacement metal gate process.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions and spatial relationship(s) of the various features may be arbitrarily enlarged or reduced for clarity. Like reference numerals denote like features throughout specification and drawings.

DETAILED DESCRIPTION

Figure 1:
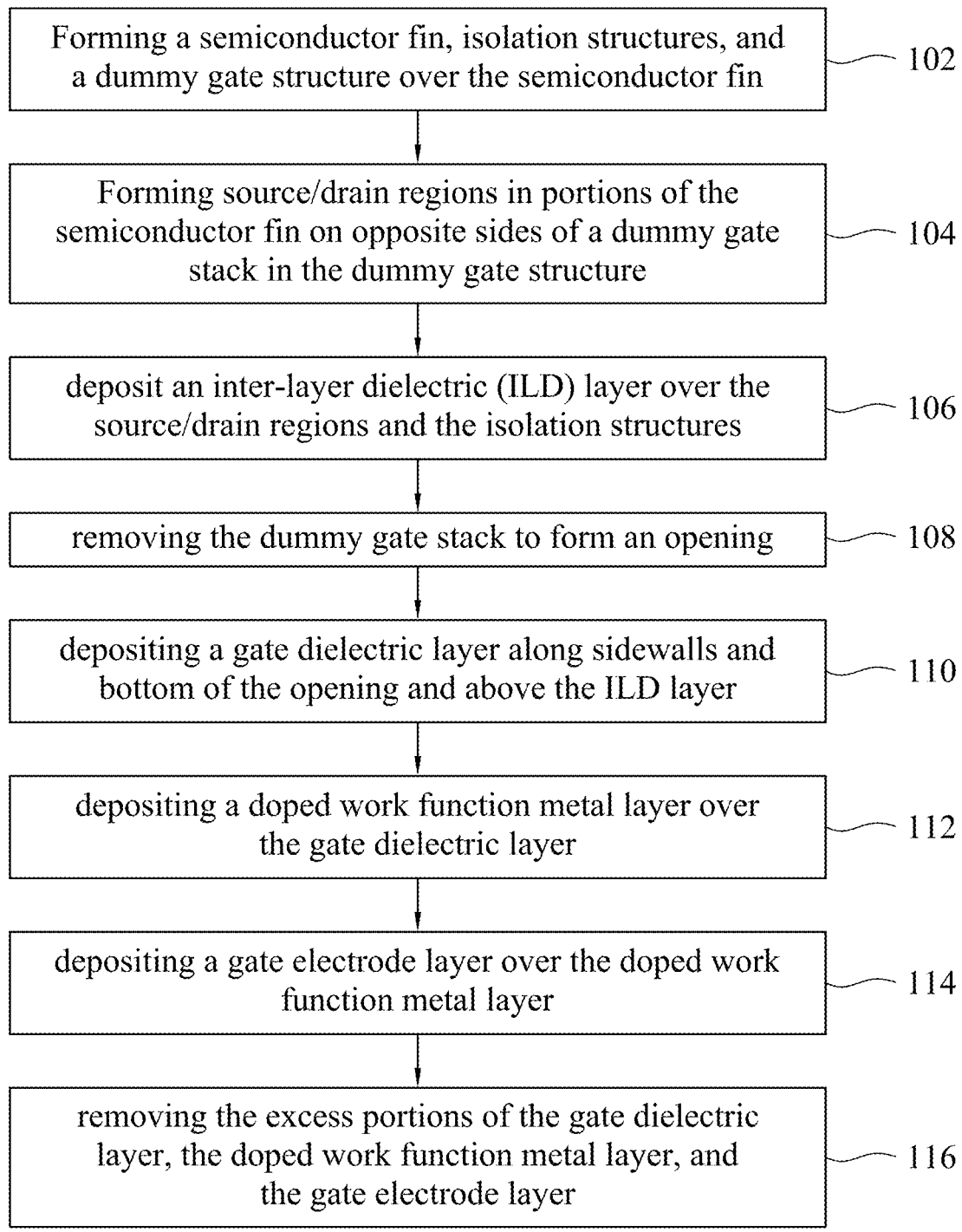
FIG. 1 is a flowchart of a method of fabricating a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a replacement metal gate process, i.e., gate last process, a dummy gate stack is formed over a semiconductor fin as a placeholder for a functional gate stack. Then, gate spacers are formed surrounding the dummy gate stack. After source/drain regions are formed adjacent to the gate spacer, the dummy gate stack is removed, leaving an opening surrounded by the spacer. Finally, a metal gate is formed in the opening. The metal gate includes a high-k gate dielectric layer, a work function metal layer, and a metal gate electrode layer.

Low resistance metals such as tungsten are often used as the metal gate electrode material. Processes for depositing bulk tungsten layers involve hydrogen reduction of tungsten-containing precursors in chemical vapor deposition (CVD) processes. One difficulty, however, with tungsten CVD deposition is that a halide by-product, such as fluoride or chloride, generated from the reduction of a halide-containing tungsten precursor, such as tungsten hexafluoride ($WF_6$) or tungsten hexachloride ($WCl_6$), diffuses across the work function metal layer into the underlying gate dielectric layer. The halide by-product, once incorporated into the gate dielectric layer, degrades the gate dielectric material, causing threshold voltage Vt variation and dielectric leakage. These conditions lead to decreased device reliability.

In some embodiments of the current description, in order to reduce or avoid degradation of the gate dielectric material and performance drifting of the FinFET, dopants are introduced into the work function metal layer. A dopant is a species added into a lattice structure of a material that is different from the main components of the material. The dopants occupy locations in a lattice structure of the work function metal, which would otherwise enable the halide by-product to diffuse into the underlying gate dielectric layer, thereby blocking the available diffusion routes through which the halide by-product is diffused. The introduction of the dopants in the work function metal layer thus helps to prevent the halide by-product from diffusing to the underlying gate dielectric layer.

FIG. 1 is a flowchart illustrating a method 100 of fabricating a semiconductor device 200 comprising a metal gate structure, in accordance with some embodiments of the present disclosure. FIGS. 2 through 9 are cross-sectional views of the semiconductor device 200 in various stages of a manufacturing process, in accordance with some embodiments. The method 100 is discussed in detail below, with reference to the semiconductor device 200, in FIGS. 2-9. In some embodiments, additional operations are performed before, during, and/or after the method 100, or some of the operations described are replaced, and/or eliminated. In some embodiments, additional features are added to the semiconductor device 200. In some embodiments, some of the features described below are replaced or eliminated. One of ordinary skill in the art would understand that although some embodiments are discussed with operations performed in a particular order, these operations may be performed in another logical order. In some embodiments, the semiconductor device 200 includes a FinFET.

Figure 2:
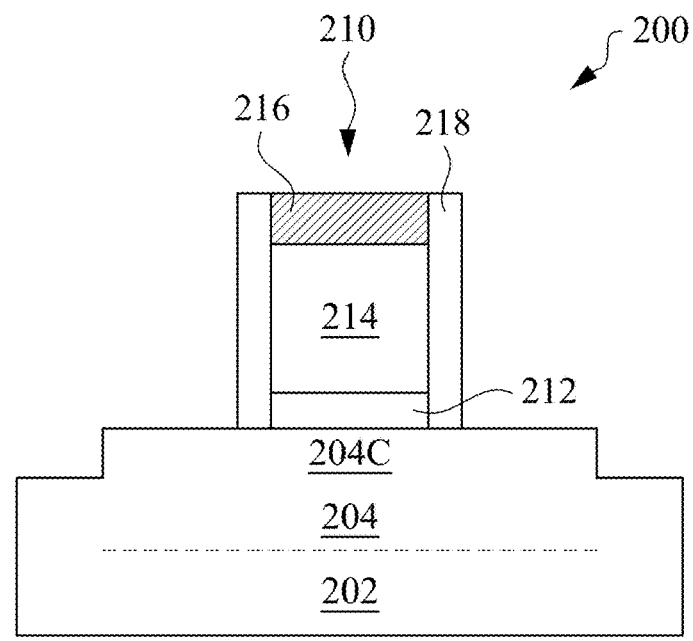
FIG. 2 is a cross-sectional view of a semiconductor device after forming a semiconductor fin, isolation structures, and a dummy gate structure over the semiconductor fin, in accordance with some embodiments.

Referring to FIG. 1 and FIG. 2, the method 100 comprises an operation 102, in which an initial structure of a semiconductor device 200 is formed on a substrate 202. The initial structure of the semiconductor device 200 includes a semiconductor fin 204 extending upwardly from the substrate 202, a plurality of isolation structures over the substrate 202 and surrounding a bottom portion of the semiconductor fin 204, and a dummy gate structure 210 over a portion of the semiconductor fin 204. Although FIG. 2 shows a single semiconductor fin 204, one of ordinary skill in the art would understand that some embodiments include multiple semiconductor fins formed over the substrate 202. Furthermore, although FIG. 2 shows a single dummy gate structure 210, one of ordinary skill in the art would understand that some embodiments include additional dummy gate structure(s) similar to and parallel to the dummy gate structure 210. One of ordinary skill in the art would further understand that in some embodiments a single dummy gate structure will extend across multiple semiconductor fins.

In some embodiments, the semiconductor fin 204 is formed by first providing a semiconductor substrate 202. In some embodiments, the semiconductor substrate is a bulk semiconductor substrate. A "bulk" semiconductor substrate refers to a substrate that is entirely composed of at least one semiconductor material. In some embodiments, the bulk semiconductor substrate includes a semiconductor material or a stack of semiconductor materials such as, for example, silicon (Si), germanium (Ge), silicon germanium (SiGe), carbon doped silicon (Si:C), silicon germanium carbon (SiGeC), or an III-V compound semiconductor such as, for example, gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as, for example, single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities that creates deficiencies of valence electrons to an intrinsic semiconductor. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. In some embodiments, the semiconductor substrate is a semiconductor-on-insulator (SOI) substrate including a top semiconductor layer formed on an insulator layer (not shown). The top semiconductor layer includes the above-mentioned semiconductor material such as, for example, Si, Ge, SiGe, Si:C, SiGeC, or an III-V compound semiconductor including GaAs, GaP, InP, InAs, InSb, GaAsP, AlInAs, AlGaAs, GaInAs, GaInP, or GaInASP. The insulator layer is, for example, a silicon oxide layer, or the like. The insulator layer is provided over a substrate, typically a silicon or glass substrate.

The semiconductor substrate 202 is then patterned to form trenches therein. The trenches define the semiconductor fin 204 in the upper portion of the semiconductor substrate, while the substrate 202 represents a remaining portion of the semiconductor substrate. In some embodiments, the semiconductor substrate is patterned using suitable lithography and etching processes. For example, a mask layer (not shown) is applied over a topmost surface of the semiconductor substrate and lithographically patterned to define a set of areas covered by a patterned mask layer. In some embodiments, the mask layer is a photoresist layer. In some embodiments, the mask layer is a photoresist layer in conjunction with hardmask layer(s). The semiconductor substrate is then patterned by an anisotropic etch using the patterned mask layer as an etch mask. In some embodiments, a dry etch such as, for example, a reactive ion etch (RIE) or a plasma etch is used. In some embodiments, a wet etch using a chemical etchant is used. In still some further embodiments, a combination of dry etch and wet etch is used. After formation of the semiconductor fin 204, the patterned mask layer is removed, for example, by oxygen plasma or ashing. Alternatively, in some embodiments, the semiconductor fin 204 is formed utilizing a sidewall image transfer (SIT) process. In a SIT process, spacers are formed on a mandrel. The mandrel is removed and the remaining spacers are used as a hard mask to etch the semiconductor substrate. The spacers are then removed after semiconductor fins are formed. In some embodiments, sequential SIT processes are utilized to form semiconductor fins with highly scaled fin width and pitches.

After formation of the semiconductor fin 204, the isolation structures (not shown in FIG. 2) are formed within trenches so that the semiconductor fin 204 protrudes from between neighboring isolation structures. The isolation structures surround a bottom portion of the semiconductor fin 204 to electrically isolate the semiconductor fin 204 from neighboring semiconductor fins (not shown). In some embodiments, the isolation structures surround a plurality of semiconductor fins 204. In some embodiments, the isolation structures include silicon oxide, silicon nitride, silicon oxynitride, and/or other suitable insulating material. In some embodiments, the isolation structures include a multi-layer structure, for example, having one or more thermal oxide liner layers disposed on the bottom portion of the semiconductor fin 204 and the substrate 202. In some embodiments, the isolation structure are shallow trench isolation (STI) structures. Other isolation structures such as filed oxide, local oxidation of silicon (LOCOS), and/or other suitable structures are possible. In some embodiments, the isolation structures are formed by filling trenches with an insulating material using suitable deposition processes. In some embodiments, the deposition of the insulating material is performed, for example, by CVD, plasma enhance chemical vapor deposition (PECVD), or spin coating. In some embodiments, the isolation structures include silicon oxide formed by a flowable CVD process (FCVD) during which a flowable oxide is deposited and a post-deposition anneal is then performed to convert the flowable oxide into silicon oxide. Excess deposited insulating material is subsequently removed from above the top surface of the semiconductor fin 204, for example, by a chemical mechanical planarization (CMP) process. After planarization, the top surfaces of the isolation structures are coplanar with the top surface of the semiconductor fin 204. Next, the isolation structures are recessed relative to the top surface of the semiconductor fin 204. In some embodiments, an etch back process that is selective to the semiconductor material of the semiconductor fin 204 is performed to recess the isolation structures. For example, in instances where the isolation structures include silicon oxide, a wet etch employing dilute hydrofluoric acid is performed to recess the isolation structures. The top portion of the semiconductor fin 204 is thus physically exposed.

The dummy gate structure 210 is formed traversing the semiconductor fin 204. The dummy gate structure 210 includes a dummy gate stack (212, 214, 216) wrapping around a portion of the semiconductor fin 204 that becomes a channel region 204C of the resulting FinFET. The term "dummy gate stack" is used throughout the present disclosure to denote a material stack that serves as a placeholder for a functional gate stack to be subsequently formed. e term "functional gate stack" as used herein refers to a permanent gate stack used to control output current (i.e., flow of carriers in the channel) of a semiconducting device through electrical fields. In some embodiments, the dummy gate stack (212, 214, 216) include one or more material layers, such as, a dummy gate dielectric layer 212, a dummy gate electrode layer 214, a dummy gate cap layer 216, or other suitable layers.

The dummy gate dielectric layer 212 is over the semiconductor fin 204. In some embodiments, the dummy gate dielectric layer 212 includes a dielectric material such as, for example, silicon oxide, silicon nitride, or silicon oxynitride. In some embodiments, the dummy gate dielectric layer 212 is formed utilizing a deposition process such as, for example, CVD, PECVD, atomic layer deposition (ALD), or physical vapor deposition (PVD). In some embodiments, the dummy gate dielectric layer 212 is formed by conversion of a surface portion of the semiconductor fin utilizing chemical oxidation, thermal oxidation, or nitridation.

The dummy gate electrode layer 214 is over the dummy gate dielectric layer 212. In some embodiments, the dummy gate electrode layer 214 includes a semiconductor material such as polysilicon or a silicon-containing semiconductor alloy such as SiGe. In some embodiments, the dummy gate electrode layer 214 is formed by a suitable deposition process such as, for example, CVD, PECVD, ALD, or PVD.

The dummy gate cap layer 216 is over the dummy gate electrode layer 214. In some embodiments, the dummy gate cap layer 216 includes a dielectric material such as, for example, silicon oxide, silicon nitride, or silicon oxynitride. In some embodiments, the dummy gate cap layer 216 is formed utilizing a deposition process such as, for example, CVD, PECVD, ALD, PVD.

In some embodiments, the various layers in the dummy gate stack (212, 214, 216) are deposited as blanket layers. Then the blanket layers are patterned using lithography and etching processes to remove portions of the blanket layers. The remaining portions of the blanket layers over the channel region 204C of semiconductor fin 204 constitute the dummy gate stack (212, 314, 216). In some embodiments, the lithography process includes forming a photoresist layer (resist) overlying the topmost surface of the blanket layers, exposing the resist to a pattern, performing post-exposure baking, and developing the resist to form a patterned photoresist layer. The pattern in the photoresist layer is sequentially transferred into the blanket layers by at least one anisotropic etch. In some embodiments, the anisotropic etch is a dry etch such as, for example, RIE. After formation of the dummy gate stack (212, 214, 216), the patterned photoresist layer is removed, for example, by wet stripping or plasma ashing.

The dummy gate structure 210 further includes gate spacers 218 along sidewalls of the dummy gate stack (212, 214, 216). The gate spacers 218 include a material different from the material(s) for the dummy gate stack (212, 214, 216). In some embodiments, the gate spacers 218 include a dielectric material such as, for example, silicon nitride, silicon carbonitride, silicon oxynitride, or silicon carbon oxynitride. In some embodiments, the gate spacers 218 include a single layer. In some embodiments, the gate spacers 218 include multiple layers of dielectric materials. In some embodiments, the gate spacers 218 are formed by conformally depositing spacer material(s) over the semiconductor fin 204, the isolation structures and the dummy gate stack (212, 214, 216) using a conformal deposition process such as, for example, CVD or ALD. Thereafter, an anisotropic etch is performed to remove horizontal portions of the deposited spacer material(s) to form the gate spacers 218. In some embodiments, the anisotropic etch includes a dry etch such as, for example, RIE.

Figure 3:
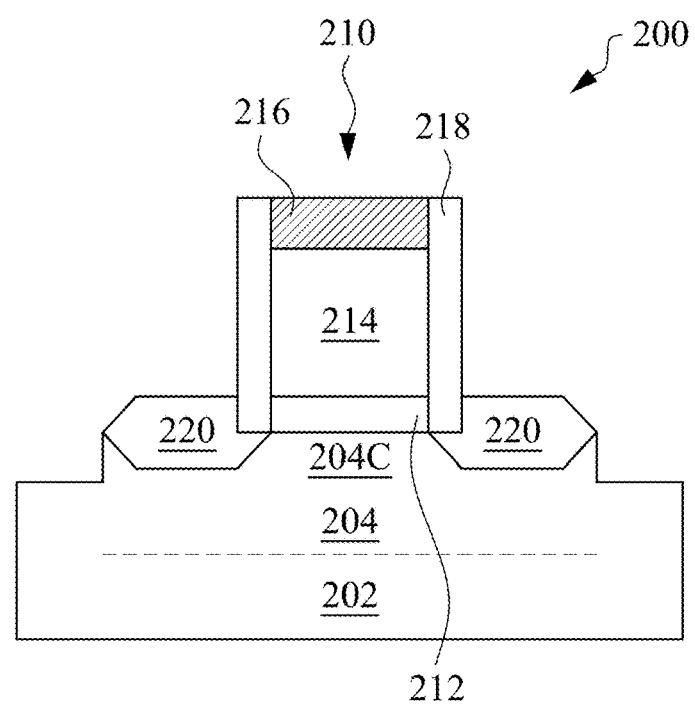
FIG. 3 is a cross-sectional view of the semiconductor device of FIG. 2 after forming source/drain regions in the semiconductor fin on opposite sides of a dummy gate stack in the dummy gate structure, in accordance with some embodiments.

Referring to FIG. 1 and FIG. 3, the method 100 proceeds to operation 104, in which a source region and a drain region (collectively referred to source/drain regions 220) are formed in portions of the semiconductor fin 204 on opposite sides of the dummy gate stack (212, 214, 216), in accordance with some embodiments. The names "source" and "drain" are interchangeable based on the voltage that is applied to those terminals when the resulting FinFET is operated.

The source/drain regions 220 are doped semiconductor regions. In some embodiments, the source/drain regions 220 include p-type dopants such as, for example, boron for a p-type FinFET. In some embodiments, the source/drain regions 220 include n-type dopants such as, for example, arsenic or phosphorus for an n-type FinFET. The source/drain regions 220 includes an epitaxial semiconductor material that is able to apply a stress on the channel region 204C of the semiconductor fin 204 to improve carrier mobility. In the embodiments in which the semiconductor device 200 is a p-type FinFET, the source/drain regions 220 include SiGe that exerts a compressive stress towards the channel region 204C of the semiconductor fin 204. In the embodiments in which the semiconductor device 200 is an n-type FET, the source/drain regions 220 include silicon phosphorous (SiP)

or Si:C that exerts a tensile stress towards the channel region 204C of the semiconductor fin 204.

In some embodiments, the source/drain regions 220 are formed by implanting dopants into portions of the semiconductor fin 204 that are not covered by the dummy gate stack (212, 214, 216) using, for example, ion implantation. In some embodiments, the source/drain regions 220 are formed by epitaxial growing a semiconductor material on portions of the semiconductor fin 204 that are not covered by the dummy gate stack (212, 214, 216). In still some further embodiments, the source/drain regions 220 are formed by etching recesses in the semiconductor fin 204 followed by performing an epitaxy to grow a semiconductor material in the recesses (FIG. 3). In some embodiments, the recesses are formed in the semiconductor fin 204, for example, by an anisotropic etch, an isotropic etch, or a combination thereof. In some embodiments, a dry etch such as, for example, RIE, is performed to remove the semiconductor material of the semiconductor fin 204 selective to the dielectric materials of the dummy gate cap layer 216, gate spacers 218, and the isolation structures, thereby forming the recesses. In some embodiments, a timed wet etch using an etchant solution of tetramethylammonium hydroxide (TMAH) or carbon tetrafluoride ($CF_4$) is performed to form the recesses. In some embodiments, the recesses are formed to have faceted surfaces. In some embodiments, the recesses have a substantially trapezoidal shape or a diamond shape. Alternatively, the recesses have other shapes, such as rectangular, rounded or elliptical shapes. In some embodiments, the recesses are formed to extend under the gate spacer 218. In some embodiments, the recesses extend under the gate spacer 218 by a distance substantially equal to the width of the gate spacers 218. The edges of the recesses are thus aligned with inner sidewalls of the gate spacer 218.

A semiconductor material is deposited in recesses to provide the source/drain regions 220. In some embodiments, a selective epitaxial growth process is performed to deposit the semiconductor material in the recesses. The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. During the selective epitaxial growth process, the deposited semiconductor material grows only on exposed semiconductor surfaces, i.e., surfaces of the recesses in the semiconductor fin 204 and does not grow on dielectric surfaces, such as surfaces of the isolation structures, the dummy gate cap layer 216 and the gate spacers 218. In some embodiments, a mask (not shown) is used to prevent the semiconductor material from growing in unwanted regions of the semiconductor fin 204. In some embodiments, the epitaxial growth process includes metalorganic chemical vapor deposition (MOCVD), molecular beam deposition (MBE), low pressure chemical vapor deposition (LPCVD), or other suitable deposition processes. In some embodiments, the epitaxial growth process continues until top surfaces of the source/drain regions 220 above the top surface of the semiconductor fin 204. In some embodiments, the epitaxial growth process is continued until the top surfaces of the source/drain regions 220 are coplanar with the top surface of the semiconductor fin 204. In some embodiments, the source/drain regions 220 are in-situ doped with dopants of p-type or n-type during the epitaxial growth process. Alternatively, in some embodiments, the source/drain regions 220 are undoped during the epitaxial growth process, and are doped during a subsequent doping process.

The subsequent doping process is achieved by an ion implantation, plasma immersion ion implantation, gas and/or solid source diffusion, other suitable processes, and/or combinations thereof. In some embodiments, source/drain regions 220 are further exposed to an annealing process to active the dopants in the source/drain regions 220 after forming the source/drain regions 220 and/or after the subsequent doping process. In some embodiments, the dopants in the source/drain regions 220 are activated by a thermal annealing process including a rapid thermal annealing process, a laser annealing process, or a furnace annealing process.

Figure 4:
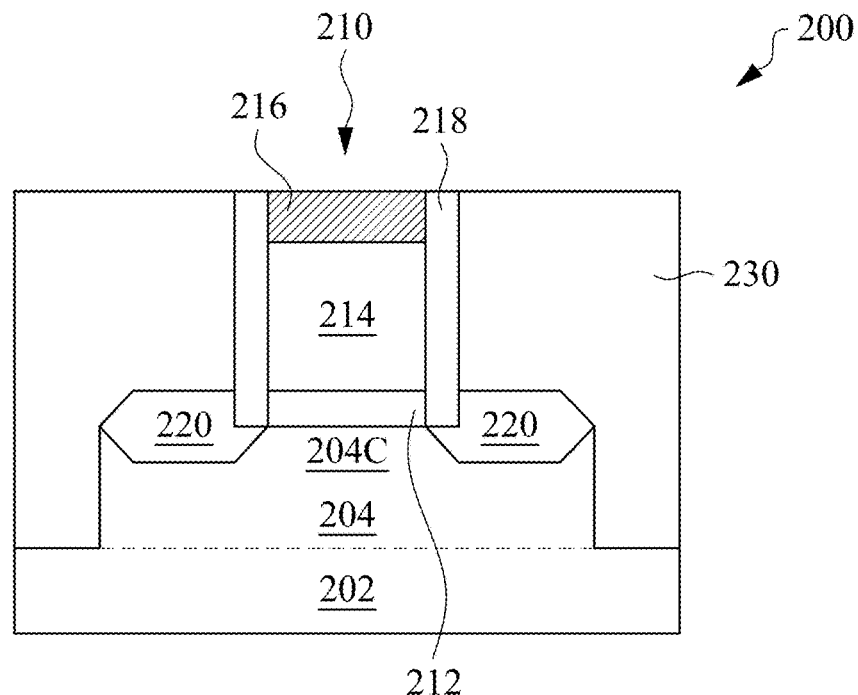
FIG. 4 is a cross-sectional view of the semiconductor device of FIG. 3 after depositing an inter-layer dielectric (ILD) layer over the source/drain regions and the isolation structures, in accordance with some embodiments.

Referring to FIG. 1 and FIG. 4, the method 100 proceeds to operation 106, in which an inter-layer dielectric (ILD) layer 230 is deposited over the source/drain regions 220 and the isolation structures. The ILD layer 230 fills the gap between the dummy gate structure 210 and adjacent dummy gate structures (not shown). In some embodiments, the ILD layer 230 includes a dielectric material such as, for example, silicon oxide, silicon nitride, tetraethylorthosilicate (TEOS) oxide, phosphorous-doped silicate glass (BPSG), boron-doped silicate glass (BSG), boron-phosphorous-doped silicate glass (PSG), fluorine doped silicate glass, an organosilicate glass (OSG), or a porous dielectric material. In some embodiments, the ILD layer 230 is deposited, for example, by CVD, PECVD, FCVD, or spin coating. In some embodiments, the ILD layer 230 is deposited to have a top surface above the topmost surface of the dummy gate stack (212, 214, 216) (e.g., the top surface of the dummy gate cap layer 216). The ILD layer 230 is subsequently planarized, for example, by a CMP process and/or a recess etch using the dummy gate cap 216 as a polishing and/or etch stop layer. After the planarization, the ILD layer 230 has a top surface coplanar with the topmost surface of the dummy gate stack (212, 214, 216).

Figure 5:
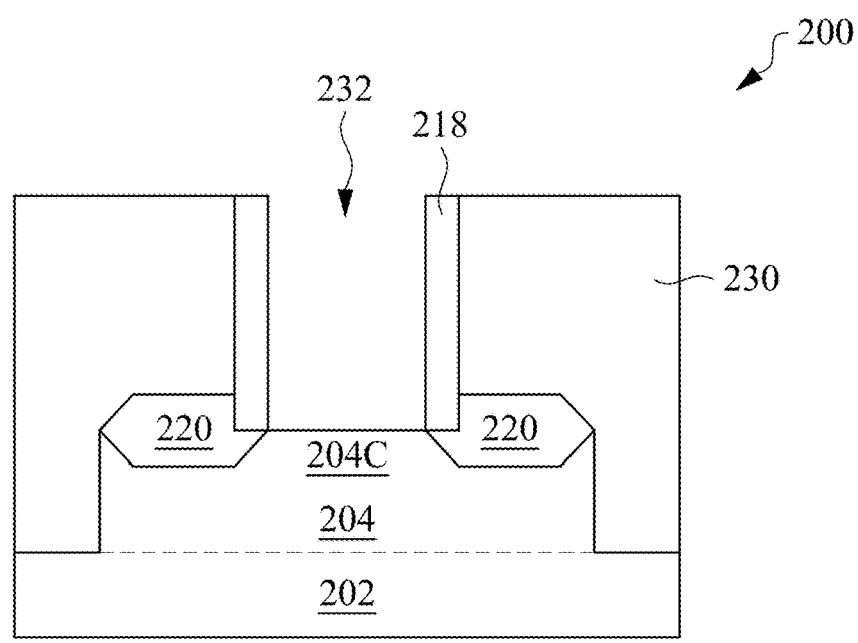
FIG. 5 is a cross-sectional view of the semiconductor device of FIG. 4 after removing the dummy gate stack to forming an opening, in accordance with some embodiments.
Figure 6:
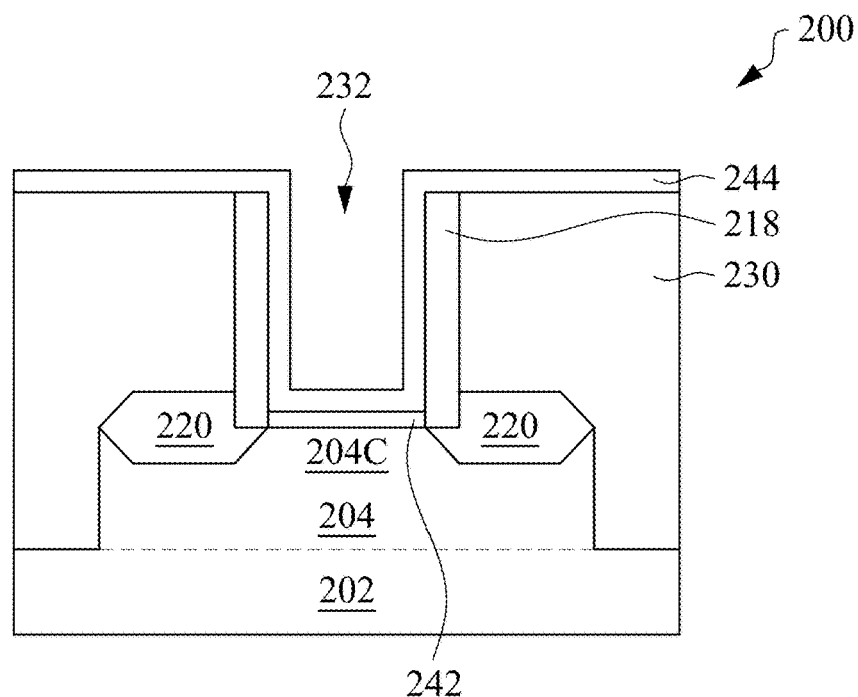
FIG. 6 is a cross-sectional view of the semiconductor device of FIG. 5 after depositing a gate dielectric layer along sidewalls and bottom of the opening and above the ILD layer, in accordance with some embodiments.

Referring to FIG. 1 and FIG. 5, the method 100 proceeds to operation 108, in which the dummy gate stack (212, 214, 216) is removed, forming an opening 232 exposing the channel region 204C of the semiconductor fin 204. The opening 232 occupies a volume from which the dummy gate stack (212, 214, 216) is removed. The opening 232 extends through the ILD layer 230 and is confined by inner sidewalls of the gate spacer 218. In some embodiments, one or more etching processes are performed to remove various components of the dummy gate stack (212, 214, 216) selective to the semiconductor material of the semiconductor fin 204 and the dielectric materials of the gate spacers 218, the isolation structures, and the ILD layer 230. In some embodiments, the etching processes include a wet etch, a dry etch, or a combination thereof. In some embodiments, a dry etch using chlorine-containing gases or fluorine-containing gases is performed. In some embodiments, a wet etch using an etchant solution of TMAH or diluted hydrofluoric acid is performed Referring to FIG. 1 and FIG. 6, the method 100 proceeds to operation 110, in which a gate dielectric layer 244 is deposited along sidewalls and bottom of the opening 232 and above the ILD layer 230. In some embodiments, prior to depositing the gate dielectric layer 244, an interfacial layer 242 is formed on the exposed surface of the channel region 204C of the semiconductor fin 204 and underneath the gate dielectric layer 244. The interfacial layer 242 is optional, and is omitted in some embodiments.

In some embodiments, the interfacial layer 242 includes a dielectric oxide such as, for example, silicon oxide. In some embodiments, the interfacial layer 242 is formed through thermal oxidation or chemical oxidation of a surface portion of the channel region 204C of the semiconductor fin 204, or by a deposition process such as ALD or CVD. In some embodiments, the chemical oxidation includes exposing the semiconductor fin 204 to a chemical oxidant such as, ozone, hydrogen peroxide, or the like.

In some embodiments, the gate dielectric layer 244 includes a high-k dielectric material having a dielectric constant greater than 3.9. Exemplary high-k dielectric materials include, but are not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum Aluminum oxide ($LaAlO_3$), and yttrium oxide ($Y_2O_3$). The gate dielectric layer 244 is deposited as a conformal layer using a suitable deposition process including, for example, CVD, PECVD, PVD, or ALD.

Figure 7:
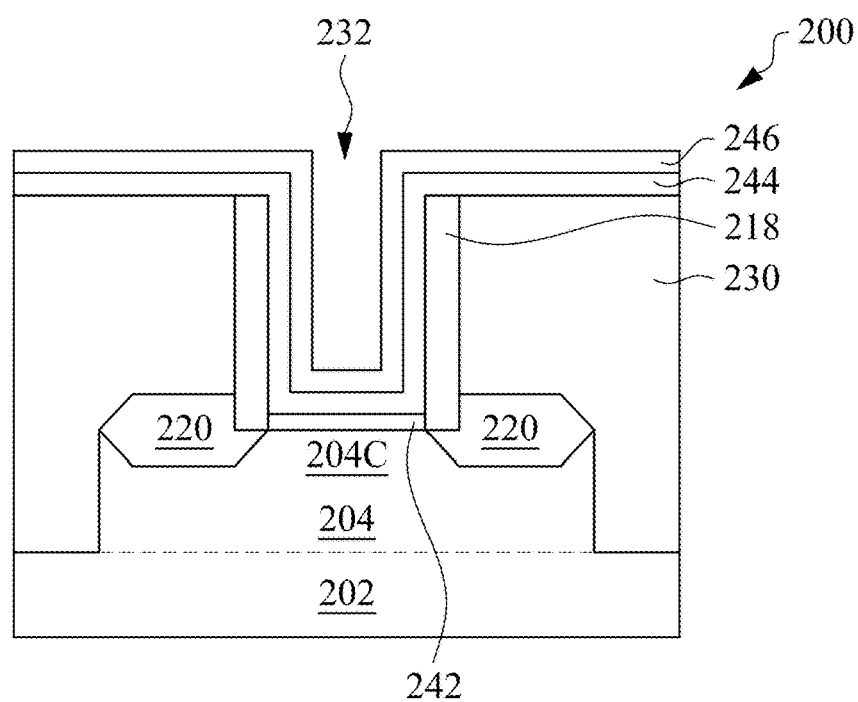
FIG. 7 is a cross-sectional view of the semiconductor device of FIG. 6 after depositing a work function material layer over the gate dielectric layer, in accordance with some embodiments.

Referring to FIG. 1 and FIG. 7, the method 100 proceeds to operation 112, in which a work function metal layer 246 is deposited over the gate dielectric layer 244. The work function metal layer 246 includes a metal having a work function suitable to tune the work function of the resulting FinFET. In some embodiments, the work function metal layer 246 includes a high work function metal having a work function value of about 4.7 eV or more for a p-type FinFET. In some embodiments, a thickness of the work function metal layer 246 ranges from about 3 nanometers (nm) to about 9 nm. If a thickness of the work function metal layer 246 is too small, a risk of insufficiently adjusting the work function of the gate of the transistor increases in some instances. If a thickness of the work function metal layer 246 is too large, a threshold voltage of a resulting transistor will be too large in some instances. Exemplary p-type work function metals include titanium nitride (TiN), tantalum nitride (TaN), ruthenium (Ru), molybdenum (Mo), zirconium silicide ($ZrSi_2$), molybdenum silicide ($MoSi_2$), tantalum silicide ($TaSi_2$), nickel silicide ($NiSi_2$), tungsten nitride (WN), other suitable p-type work function materials, or combinations thereof. In some embodiments, the work function metal layer 246 includes TiN for a p-type FinFET. In some embodiments, the work function metal layer 246 includes a low work function metal having a work function value of about 4.5 eV or less for an n-type FinFET. Exemplary n-type work function metals include tantalum (Ta), titanium aluminide (TiAl), tantalum aluminide (TaAl), tantalum aluminum carbide (TaAlC), titanium aluminum nitride (TiAlN), tantalum carbide (TaC), tantalum carbonitride (TaCN), tantalum silicon nitride (TaSiN), other suitable n-type work function materials, or combinations thereof. In some embodiments, the work function metal layer 246 includes TiAl for an n-type FinFET.

The work function metal layer 246 is doped with dopants (i.e., impurities) comprising at least one halide-blocking element such as, for example, boron (B), nitrogen (N), aluminum (Al), silicon (Si), phosphorus (P), gallium (Ga), germanium (Ge), arsenic (As), indium (In), tin (Sn), antimony (Sb), titanium (Ti), lead (Pb), bismuth (Bi), and carbon (C), a mixture of carbon and a hydrocarbon species, or a mixture of carbon, a hydrocarbon species and oxygen. The dopants occupy locations in a lattice structure of the work function metal which would otherwise enable the halide by-product generated during the deposition process used for formation of the gate electrode layer 248 (FIG. 8) to diffuse through the work function metal layer 246 into the gate dielectric layer 244. The dopants help to block a number of available diffusion routes through which the halide by-product is able to diffuse into the gate dielectric layer 244. The amount of dopants in the work function metal layer 246 is adjusted to provide a suitable level of blocking effect. In some embodiments, the concentration of dopants in the work function metal layer 246 is from about 0.5% to about 5% by weight. If the dopant concentration is too small, the work function metal layer 246 will be unable to sufficiently block the halide by-product diffusion, in some instances. If the dopant concentration is too great, the resistance of the work function metal layer 246 will be high, in some instances. One of ordinary skill in the art would recognize that the concentration of dopants depends on a size of the dopant species and a material of the work function metal layer 246. For example, as a size of the dopant species increases the concentration of the dopant is in the lower portion of the above range in some instances. In some embodiments, the dopants are distributed uniformly throughout the work function metal layer 246. In some embodiments, the dopants forms a dopant gradient within the work function metal layer 246. In some embodiments, the work function metal layer 246 has a dopant concentration which increase to a maximum as the distance from gate dielectric layer 244 increases and decreases from the maximum as the distance from the gate dielectric layer 244 continues to increase. In some embodiments, the maximum dopant concentration is at about 2 nm to about 5 nm from an interface between the work function metal layer 246 and the gate dielectric layer 244. In some embodiments, the location of the maximum dopant concentration from the interface between the work function metal layer 246 and the gate dielectric layer 244 ranges from about 20% to about 70% of a total thickness of the work function metal layer 246. If the maximum dopant concentration is too close to the interface between the work function metal layer 246 and the gate dielectric layer 244, a risk of the dopants entering the gate dielectric layer 244 increases in some instances. If the maximum dopant concentration is too far from the interface between the work function metal layer 246 and the gate dielectric layer 244, effectiveness of the dopant in protecting the gate dielectric layer 244 is reduced in some instances. The dopants are confined within the work function metal layer 246 such that the underlying gate dielectric layer 244 and interfacial layer are free of any of these halide-blocking dopants.

In some embodiments, the work function metal layer 246 is formed using ALD, PVD, CVD, e-beam evaporation, or other suitable deposition processes. In some embodiments, the work function metal layer 246 is doped using an ion implantation process after formation of the work function metal layer 246. In some embodiments, the ion implantation process is performed at an implantation energy ranging from about 130 kilo-electron volts (KeV) to about 150 KeV. In some embodiments, the work function metal layer 246 is doped using an in-situ doping process. In some embodiments, the ion implantation process is performed using an implantation angle ranging from about 5 degrees to about 10 degrees. In some embodiments, the in-situ doping process includes introducing a dopant precursor into the deposition chamber during the formation of the work function metal layer 246. In some embodiments, the work function metal layer 246 includes TiAl and is formed while in-situ doped using a combination of titanium chloride (TiCl4), TEAL ($Al_2(C_2H_5)_6$) and other impurities. In some embodiments, the impurities include a hydrocarbon, chlorine, an organosilicon material or another suitable material. In some embodiments, an amount of impurities is less than 10% but greater than 0% of a total flow of material into the deposition chamber during formation of the work function metal layer 246. In some embodiments, an amount of impurities is less than 5% but greater than 0% of a total flow of material into the deposition chamber during formation of the work function metal layer 246. In some embodiments, an amount of impurities is less than 1% but greater than 0% of a total flow of material into the deposition chamber during formation of the work function metal layer 246. As an amount of impurities decreases, a cost of materials for the production process increases. If an amount of impurities is too high, the ability of the impurities will negatively impact the formation of the work function metal layer 246 in some instances. If the amount of impurities is 0% then the lattice structure of the work function metal layer 246 lacks dopants to block by-products from reaching the gate dielectric layer 244. In the embodiments in which the work function metal layer 246 is doped with carbon, the impurities include a hydrocarbon ($C_xH_y$) such as, for example CO, $CO_2$, $CH_2O$, CH, $CH_2$, $CH_3$, $CH_4$, $C_2H_6$, $C_7H_7$, $C_{16}H_{10}$, or another suitable hydrocarbon is co-flowed to the reaction chamber with the precursors that form the work function metal layer 246. By filling the spaces within the lattice structure, the hydrocarbon helps to prevent by-products from being able to pass through the lattice structure of the work function metal layer 246.

Figure 8:
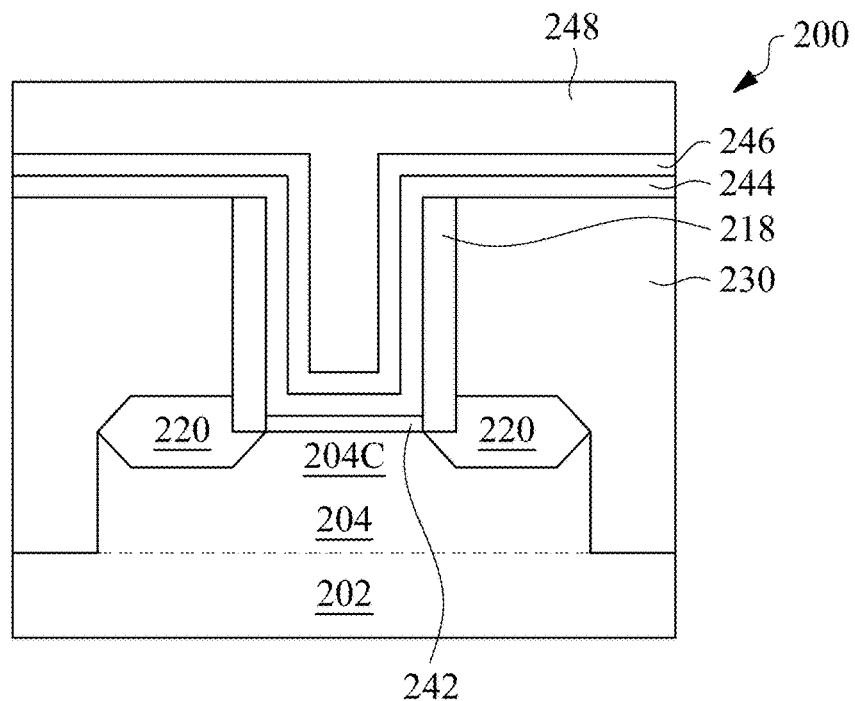
FIG. 8 is a cross-sectional view of the semiconductor device of FIG. 7 after depositing a gate electrode layer over the work function material layer, in accordance with some embodiments.

Referring to FIG. 1 and FIG. 8, the method 100 proceeds to operation 114, in which a gate electrode layer 248 is deposited over the work function metal layer 246. The gate electrode layer 248 fills the remaining volume of the opening 232. In some embodiments, the gate electrode layer 248 includes a low resistance metal such as, for example, tungsten, copper, cobalt and/or other suitable materials. In some embodiments, the gate electrode layer 248 is deposited by CVD, PVD, plating, and/or other suitable processes. In some embodiments, the gate electrode layer 248 includes tungsten and is formed by reducing a tungsten-containing precursor such as $WF_6$ in a reduction gas, such as a diborane ($B_2H_6$) gas or hydrogen gas ($H_2$). The reaction between the tungsten-containing precursor produces metallic tungsten to form the gate electrode layer 248. The reaction also produces by-products such as fluorine ions ($F^-$) as well as hydrofluoric acid (HF). In some embodiments, the gate electrode layer 248 is formed by reducing $WF_6$, for example by $WF_6 + 3H_2 \rightarrow W + HF + 5H^+ + 5F^-$. The dopants in work function metal layer 246 help to prevent these by-products from migrating from the deposited gate electrode layer 248 through the doped work function metal layer 246 and into the gate dielectric layer 244. As a result, the gate dielectric layer 244 is less likely to be damaged and the FinFET is more likely to function as designed.

As noted above, in some instances, the reaction chemistry associated with the formation of the gate electrode layer 248 generates a halide by-product (e.g., fluoride or chloride). The halide by-product diffuses through the work function metal layer 246 into the gate dielectric layer 244, causing the degradation of the gate dielectric material. The dopants in the work function metal layer 246 help to block the halide by-product from diffusing into the gate dielectric layer 244, thereby helps to prevent the degradation of the high-k dielectric material in the underlying gate dielectric layer 244. Accordingly, the performance and the reliability of the resulting FinFET are improved.

Figure 9:
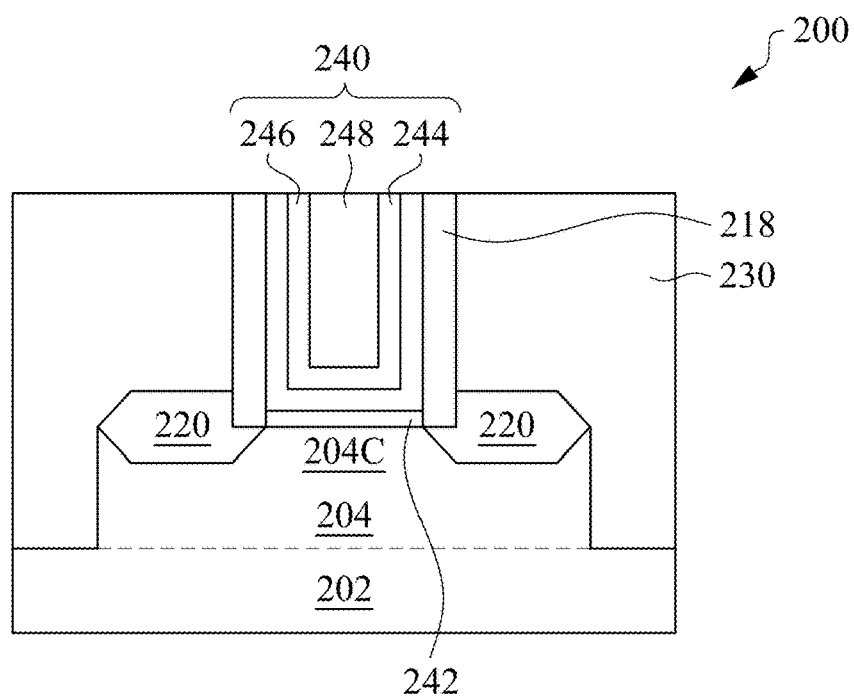
FIG. 9 is a cross-sectional view of the semiconductor device of FIG. 8 after removing excess portions of the gate dielectric layer, the work function material layer, and the gate electrode layer above the ILD layer, in accordance with some embodiments.

Referring to FIG. 1 and FIG. 9, the method 100 proceeds to operation 116, in which the excess portions of the gate dielectric layer 244, the doped work function metal layer 246, and the gate electrode layer 248 are removed. In some embodiments, a planarization process, such as, a CMP process is performed to remove portions of the gate dielectric layer 244, the work function metal layer 246, and the gate electrode layer 248 from the top surface of the ILD layer 230. The resulting remaining portions of the gate dielectric layer 244, the work function metal layer 246 and the gate electrode layer 248 in the opening 232 form a functional gate stack 240 over the channel region 204C of the resulting FinFET. In some embodiments, each of the remaining portions of the gate dielectric layer 244, the work function metal layer 246, and the gate electrode layer 248 includes a bottom portion, and sidewall portions over and connected to the bottom portion.

Figure 10:
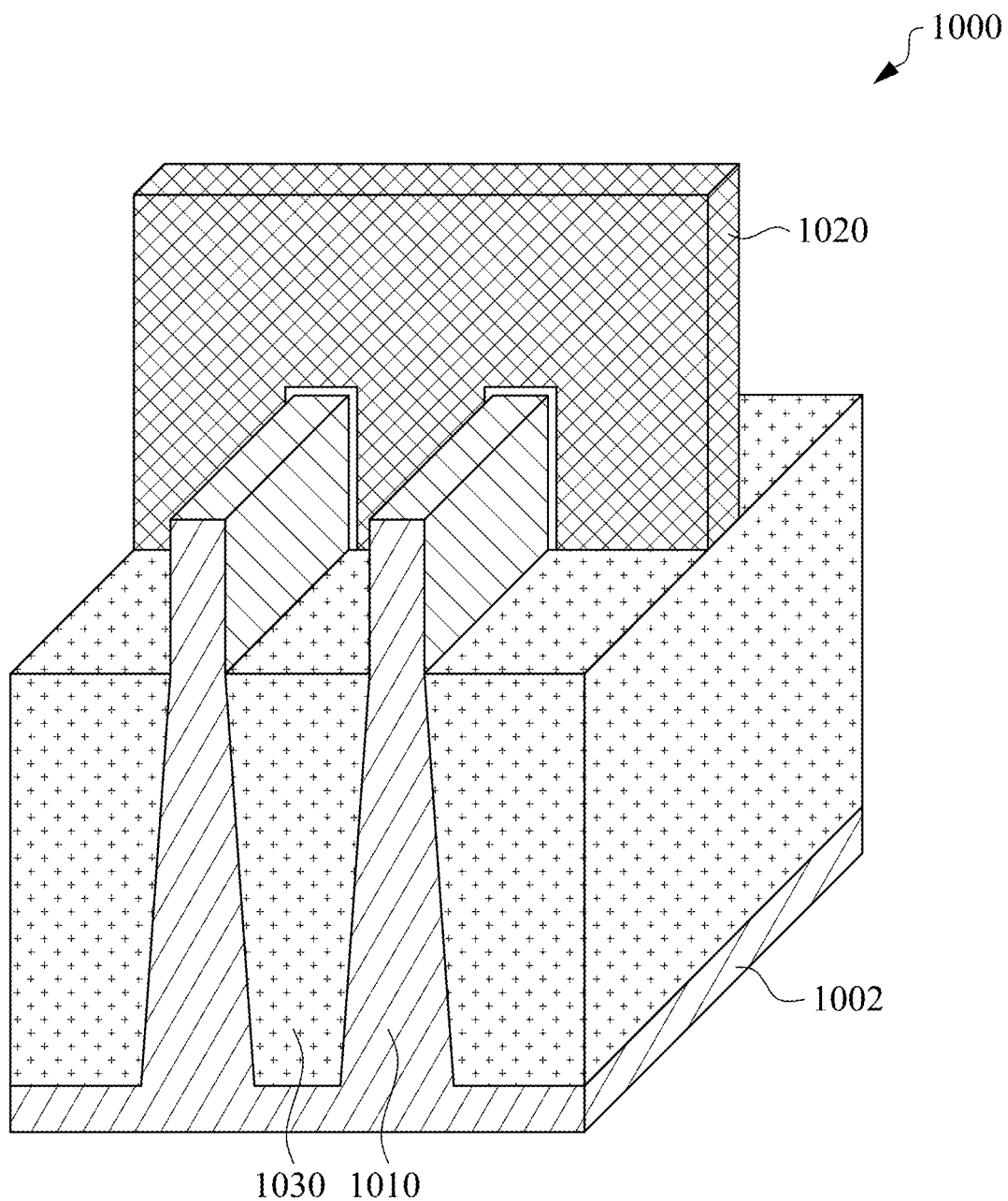
FIG. 10 is a perspective view of a FinFET, in accordance with some embodiments.

FIG. 10 is a perspective view of a FinFET 1000, in accordance with some embodiments. A FinFET 1000 normally includes multiple semiconductor fins 1010 above a semiconductor substrate 1002, and a gate structure 1020 over the semiconductor substrate 1002 and straddling the semiconductor fins 1010. Shallow trench isolation (STI) structures 1030 are between the semiconductor fins 1010 to electrically insulate the semiconductor fins 1010.

In an integrated circuit, FinFETs having different fin numbers are formed in different regions of a semiconductor substrate. A manufacturing technique that is employed in manufacturing FinFETs with different fin numbers is to initially form trenches in a semiconductor substrate to define an array of uniformly spaced semiconductor fins across the entire substrate, followed by removing some dummy fins to define active semiconductor fins in device regions. STI structures are then formed to separate and isolate the active and dummy semiconductor fins from each other. Generally, fabricating the STI structures involves deposition of a dielectric material to fill spaces between the active and dummy semiconductor fins.

As FinFETs are scaled to meet ever increasing performance and size requirements, the width of the fins has become very small, and the fin pitch has also been significantly decreased. The reduced fin pitch makes filling the dielectric between the fins challenging. Flowable dielectric materials are thus introduced to provide scalable, defect-free, high yield dielectric fill between semiconductor fins, in some instances. When forming STI structures, a flowable dielectric material is deposited to fill gaps between semiconductor fins using a flowable chemical vapor deposition (FCVD) process. After the flowable dielectric film is deposited, the flowable dielectric film is cured and then annealed to form a dielectric layer, e.g., silicon dioxide. The flowable dielectric film is usually annealed at a high temperature, e.g., greater than 1000° C. to densify the film so as to obtain the desired mechanical property.

The high temperature annealing consumes silicon atoms in the active semiconductor fins due to the reaction of silicon atoms and the water vapor in the processing chamber, which in turn causes shrinkage of fin critical dimensions (CDs). Active semiconductor fins in the different device regions having different fin numbers experience different flowable dielectric loading effects, i.e., the fin CD losses in different device regions are different. A larger volume of flowable dielectric between adjacent fins has a more significant impact on the fin CDs than a smaller volume of flowable dielectric. As a result, the final CDs of active semiconductor fins in different device regions vary based on fin density. The fin CD variation in different device regions affects the consistency of device performance.

Improving fin CD control provides more consistent device performance in an integrated circuit. In some embodiments, the STI structures are formed before the removal of non-functional dummy fins such that all the semiconductor fins on the semiconductor substrate experience the same dielectric loading environment during the high temperature annealing of the flowable dielectric material for formation of the STI structures. By annealing the flowable dielectric material before the fin cut stage, the fin CD shrinkage differences caused by the different flowable dielectric loading effects in different device regions are avoided. The more uniform fin CDs help to produce FinFETs with more consistent device performance.

An aspect of this description relates to a method of fabricating a semiconductor device. The method includes forming a dummy gate structure over a semiconductor fin. The dummy gate structure includes a dummy gate stack and gate spacers along sidewalls of the dummy gate stack. The method further includes forming an inter-layer dielectric (ILD) layer surrounding the dummy gate structure, removing the dummy gate stack to provide an opening exposing a channel region of the semiconductor fin, depositing a gate dielectric layer over bottom and sidewalls of the opening and over the ILD layer, forming a doped work function material layer over the gate dielectric layer using an in-situ doping process, and depositing a gate electrode layer over the doped work function material layer. In some embodiments, forming the doped work function material layer comprises forming the doped work function material layer using a precursor gas mixture having less than 10% impurities. In some embodiments, depositing the gate electrode layer comprises forming by-products in the gate electrode layer. In some embodiments, forming by-products in the gate electrode layer comprises forming fluorine ions in the gate electrode layer. In some embodiments, forming the doped work function material layer includes using the precursor gas mixture includes $WF_6$ and hydrogen gas.

An aspect of this description relates to a method of fabricating a semiconductor device. The method includes forming a dummy gate structure over a channel region, wherein the dummy gate structure comprises a dummy gate stack and gate spacers along sidewalls of the dummy gate stack. The method further includes removing the dummy gate stack to expose the channel region. The method further includes depositing a gate dielectric layer over bottom of the opening. The method further includes forming a doped work function material layer over the gate dielectric layer, wherein the doped work function material layer has a variable dopant concentration. The method further includes depositing a gate electrode layer over the doped work function material layer. In some embodiments, forming the doped work function material layer includes forming the doped work function material layer having a thickness ranging from about 3 nanometers (nm) to about 9 nm. In some embodiments, forming the doped work function material layer includes forming the doped work function material layer having a maximum concentration of dopants in the doped work function material is between about 2 nm and about 5 nm from an interface between the gate dielectric layer and the doped work function material layer. In some embodiments, forming the doped work function material layer includes using an in-situ doping process. In some embodiments, forming the doped work function material layer includes depositing the work function material layer; and implanting dopants into the deposited work function material layer. In some embodiments, forming the doped work function material layer includes using dopants comprising a halide-blocking element. In some embodiments, forming the doped work function material layer includes using dopants including a hydrocarbon. In some embodiments, forming the doped work function material layer includes using dopants further including carbon. In some embodiments, forming the doped work function material layer includes using dopants further including oxygen. In some embodiments, forming the doped work function material layer includes forming the doped work function material layer having a dopant concentration ranging from about 0.5% by weight to about 5.0% by weight. In some embodiments, forming the doped work function material layer includes forming the doped work function material layer having a maximum dopant concentration at about 20% to about 70% of a total thickness of the doped work function material layer from an interface with the gate dielectric layer.

An aspect of this description relates to a method of fabricating a semiconductor device. The method includes forming a dummy structure over a channel region, wherein the dummy structure comprises a dummy stack. The method further includes forming a dielectric layer surrounding the dummy structure. The method further includes removing the dummy stack following forming the dielectric layer to form an opening. The method further includes depositing a second dielectric layer in the opening. The method further includes forming a doped work function material layer over the second dielectric layer, wherein the doped work function material layer has a variable dopant concentration. The method further includes depositing a conductive layer over the doped work function material layer. In some embodiments, forming the doped work function material layer includes forming the doped work function material layer having a maximum dopant concentration in a central region of the doped work function material layer in a thickness direction of the doped work function material layer. In some embodiments, removing the dummy stack includes exposing a channel region. In some embodiments, the method further includes removing the second dielectric layer and the doped work function layer from a top most surface of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:

forming a dummy gate structure over a semiconductor fin, wherein the dummy gate structure comprises a dummy gate stack and gate spacers along sidewalls of the dummy gate stack;

forming an inter-layer dielectric (ILD) layer surrounding the dummy gate structure;

removing the dummy gate stack to provide an opening exposing a channel region of the semiconductor fin;

depositing a gate dielectric layer over bottom and sidewalls of the opening and over the ILD layer;

forming a doped work function material layer over the gate dielectric layer using an in-situ doping process, wherein the doped work function material layer comprises dopants throughout an entirety of the doped work function material layer, and the doped work function material layer has a variable dopant concentration; and depositing a gate electrode layer over the doped work function material layer.

2. The method of claim 1, wherein forming the doped work function material layer comprises forming the doped work function material layer using a precursor gas mixture having less than 10% impurities based on a total flow rate of the precursor gas.

3. The method of claim 1, wherein depositing the gate electrode layer comprises forming by-products in the gate electrode layer.

4. The method of claim 3, wherein forming by-products in the gate electrode layer comprises forming fluorine ions in the gate electrode layer.

5. The method of claim 2, wherein forming the gate electrode layer includes using the precursor gas mixture includes $WF_6$ and hydrogen gas.

6. A method of fabricating a semiconductor device, comprising:
   forming a dummy gate structure over a channel region, wherein the dummy gate structure comprises a dummy gate stack and gate spacers along sidewalls of the dummy gate stack;
   removing the dummy gate stack to expose the channel region;
   depositing a gate dielectric layer over a bottom of the opening;
   forming a doped work function material layer over the gate dielectric layer, wherein the doped work function material layer has a variable dopant concentration, wherein the doped work function material layer comprises dopants throughout an entirety of the doped work function material layer; and
   depositing a gate electrode layer over the doped work function material layer.

7. The method of claim 6, wherein forming the doped work function material layer comprises forming the doped work function material layer having a thickness ranging from about 3 nanometers (nm) to about 9 nm.

8. The method of claim 7, wherein forming the doped work function material layer comprises forming the doped work function material layer having a maximum concentration of dopants in the doped work function material is between about 2 nm and about 5 nm from an interface between the gate dielectric layer and the doped work function material layer.

9. The method of claim 6, wherein forming the doped work function material layer comprises using an in-situ doping process.

10. The method of claim 6, wherein forming the doped work function material layer comprises:
    depositing the work function material layer; and
    implanting dopants into the deposited work function material layer.

11. The method of claim 6, wherein forming the doped work function material layer comprises using dopants comprising a halide-blocking element.

12. The method of claim 6, wherein forming the doped work function material layer comprises using dopants comprising a hydrocarbon.

13. The method of claim 12, wherein forming the doped work function material layer comprises using dopants further comprising carbon.

14. The method of claim 12, wherein forming the doped work function material layer comprises using dopants further comprising oxygen.

15. The method of claim 6, wherein forming the doped work function material layer comprises forming the doped work function material layer having a dopant concentration ranging from about 0.5% by weight to about 5.0% by weight.

16. The method of claim 6, wherein forming the doped work function material layer comprises forming the doped work function material layer having a maximum dopant concentration at about 20% to about 70% of a total thickness of the doped work function material layer from an interface with the gate dielectric layer.

17. A method of fabricating a semiconductor device, comprising:
    forming a dummy structure over a channel region, wherein the dummy structure comprises a dummy stack;
    forming a dielectric layer surrounding the dummy structure;
    removing the dummy stack following forming the dielectric layer to form an opening;
    depositing a second dielectric layer in the opening;
    forming a doped work function material layer over the second dielectric layer, wherein the doped work function material layer has a variable dopant concentration, wherein the doped work function material layer comprises dopants throughout an entirety of the doped work function material layer; and
    depositing a conductive layer over the doped work function material layer.

18. The method of claim 17, wherein forming the doped work function material layer comprises forming the doped work function material layer having a maximum dopant concentration in a central region of the doped work function material layer in a thickness direction of the doped work function material layer.

19. The method of claim 17, wherein removing the dummy stack comprises exposing a channel region.

20. The method of claim 17, further comprising removing the second dielectric layer and the doped work function layer from a top most surface of the dielectric layer.

* * * * *